United States Patent
Haerle et al.

(10) Patent No.: US 7,235,920 B2
(45) Date of Patent: Jun. 26, 2007

(54) DISPLAY DEVICE AND METHOD OF ITS MANUFACTURE

(75) Inventors: Volker Haerle, Laaber (DE); Berthold Hahn, Hemau (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 96 days.

(21) Appl. No.: 10/670,917

(22) Filed: Sep. 24, 2003

(65) Prior Publication Data
US 2005/0073248 A1  Apr. 7, 2005

Related U.S. Application Data

(60) Provisional application No. 60/450,068, filed on Feb. 24, 2003.

(51) Int. Cl.
H05B 33/00 (2006.01)
H01J 9/00 (2006.01)

(52) U.S. Cl. .................. 313/499; 313/504; 257/77; 257/79; 257/103; 257/613; 349/11; 445/24

(58) Field of Classification Search ........ 313/498–512; 257/49, 59, 72, 77, 79, 103, 350, 613; 349/11
See application file for complete search history.

(56) References Cited

U.S. PATENT DOCUMENTS

| | | | |
|---|---|---|---|
| 5,374,564 A | 12/1994 | Bruel | |
| 5,989,752 A * | 11/1999 | Chiu | 430/5 |
| 6,246,179 B1 * | 6/2001 | Yamada | 315/169.3 |
| 6,309,907 B1 * | 10/2001 | Forbes et al. | 438/105 |
| 6,433,487 B1 * | 8/2002 | Yamazaki | 315/169.3 |
| 6,563,174 B2 * | 5/2003 | Kawasaki et al. | 257/350 |
| 6,638,846 B2 * | 10/2003 | Iwata et al. | 438/608 |
| 6,680,577 B1 * | 1/2004 | Inukai et al. | 315/169.3 |
| 6,689,492 B1 * | 2/2004 | Yamazaki et al. | 428/690 |
| 6,727,522 B1 * | 4/2004 | Kawasaki et al. | 257/103 |
| 6,838,308 B2 * | 1/2005 | Haga | 438/104 |
| 6,936,846 B2 * | 8/2005 | Koyama et al. | 257/71 |
| 6,975,067 B2 * | 12/2005 | McCormick et al. | 313/512 |
| 2001/0000005 A1 * | 3/2001 | Forrest et al. | 204/192.12 |

FOREIGN PATENT DOCUMENTS

| | | |
|---|---|---|
| DE | 19950839 A1 | 5/2001 |
| EP | 1 134 811 A1 | 9/2001 |
| EP | 1 450 587 | 8/2004 |
| JP | 06-067187 | 3/1994 |
| WO | WO 97/06554 A2 | 2/1997 |

OTHER PUBLICATIONS

R. L. Hoffmann et al., "ZnO-based Transparent Thin-Film Transistor", Feb. 3, 2003, Applied Physics Letters, vol. 82, No. 5, pp. 733-735.

* cited by examiner

Primary Examiner—Ashok Patel
(74) Attorney, Agent, or Firm—Fish & Richardson P.C.

(57) ABSTRACT

A display device and method for its manufacture. In a display device with a first array of individual display elements and a second array of control transistors for the display elements, control transistors are formed from a semiconductor material with a large band gap and are transparent in the visible spectral range. The invention also comprises a method for manufacturing such a display device.

28 Claims, 1 Drawing Sheet

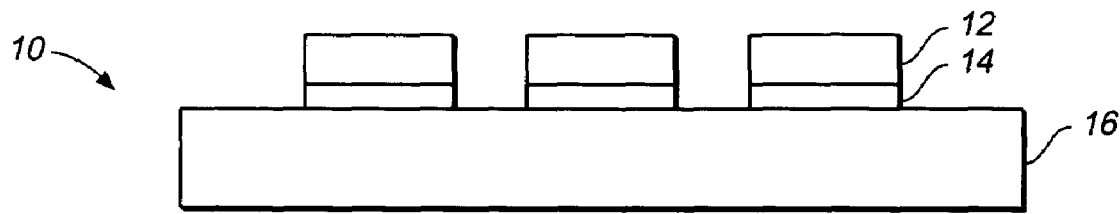
FIG._1
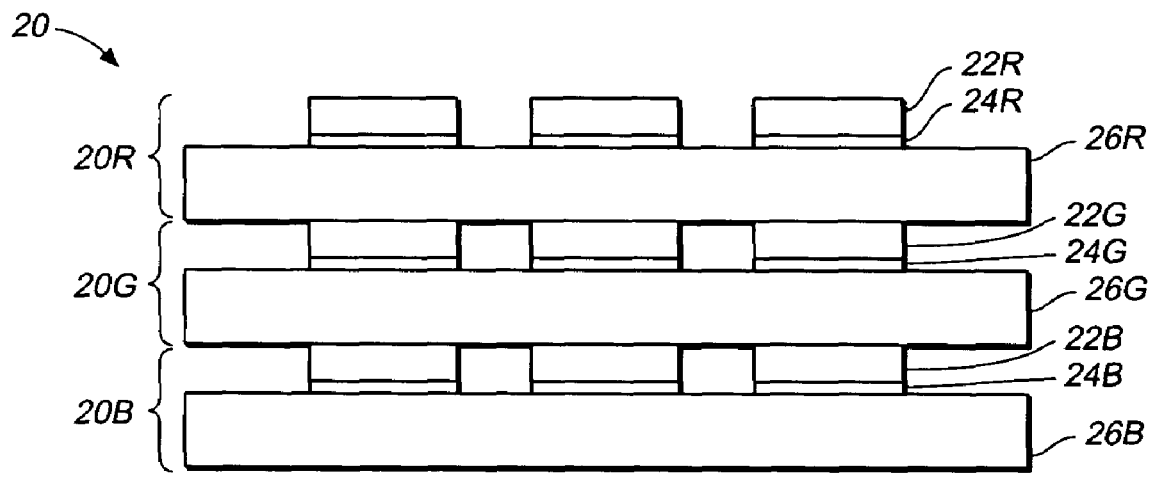
FIG._2
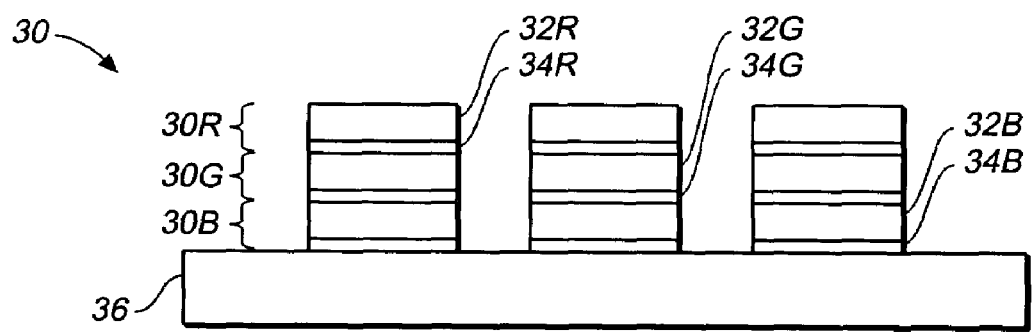
FIG._3

DISPLAY DEVICE AND METHOD OF ITS MANUFACTURE

CROSS-REFERENCE TO RELATED APPLICATIONS

This application claims the benefit of U.S. Provisional Application Ser. No. 60/450,068, filed on Feb. 24, 2003.

BACKGROUND

The present invention relates to display devices. Traditionally, there are two standard methods for controlling liquid crystal display (LCD) devices: passive matrix control and active matrix control. A passive matrix, in which the display elements are actuated in a line-column multiplex mode, is typically used with smaller arrays or when relatively low display quality is required. An active matrix, in which a thin film transistor (TFT) electronic element that includes amorphous or polycrystalline silicone on a glass carrier, is used with higher-quality applications.

In display devices with organic light emitters (OLEDs, organic light emitting diodes), thin film transistors can also be used to directly control the individual display elements forming the pixels.

When silicon transistors are used, unwanted currents occur in both cases during the generation of visible light due to photo-absorption, because the photon energy of the generated light is greater than the band gap of silicon. Therefore, transistors are currently used only underneath the structures, so as to not cause substantial absorption losses.

SUMMARY

One objective of the present invention is to provide a display device with improved control electronics, for the purpose of reducing or, if possible, completely eliminating absorption losses in the control electronics of the display device.

This objective is potentially accomplished by a display device and a manufacturing method of such a device having the features recited in the claims. Advantageous embodiments and enhancements of the display device and/or the manufacturing process are presented in the dependent claims.

The invention is generally based on the concept of using transparent semiconductor structures for the control transistor arrays in which, because of the large band gap, significantly reduced or essentially no photo-absorption takes place in the transistor system.

For example, in a display device according to an implementation of the invention, the control transistors can be formed from a semiconductor material with a large band gap and are transparent in the visible spectral range. As a result, the problem of unwanted currents can be reduced or avoided.

In one embodiment of the display device, the display elements include organic light-emitting elements. The organic light-emitting elements can be formed as a layer sequence that includes a cathode, an electron transport layer, an organic light-emitting layer, a hole transport layer, and an anode.

In another embodiment of the display device, the display elements include liquid crystal elements. The band gap of the semiconductor material of the control transistors can be larger than 3 eV.

In another embodiment of the display device, the semiconductor material of the control transistors includes one or more of BN, Ga(In, Al)N, ZnO, a II–VI semiconductor (such as ZnS), SiC and diamond. Hetero-structures including the aforementioned semiconductor materials can also fall within the scope of the invention.

The control transistors can be formed in one or more thin layers of the semiconductor material. The thin layer(s) of the semiconductor material can have a layer thickness of approximately 0.5 µm to approximately 20 µm, and can be manufactured using methods known in the art, such as the "SMART-cut" method of the Soitec Company, which is described in U.S. Pat. No. 5,374,564.

According to an embodiment of the display device of the invention, an array of display elements can contain several sub-arrays, whose respective display elements are designed and configured for representing various colors. In particular, the array of display elements can include three sub-arrays, whose respective display values are designed and configured to represent red, green and blue. By combining these three basic colors, the colors of the color space can, for the most part, be represented in a manner known in the art.

The large band gap of the control transistors can ensure that the radiation of the control elements is absorbed by the control electronics to a negligible extent or essentially not at all, so that photo-absorption and unwanted currents essentially do not occur.

According to a first embodiment of the display device, the multiple sub-arrays are disposed in the same plane on a carrier substrate. Alternatively, according to a second embodiment, the multiple sub-arrays are disposed in stacked layers in multiple planes. Each of the multiple sub-arrays can be disposed on its own carrier substrate, such as a glass plate, or the display elements of the sub-arrays are disposed in directly and vertically stacked layers on the transparent carrier.

In a method for manufacturing such a display device, a thin layer of a semiconductor material with a large band gap can be produced, and the thin layer can be applied to a transparent carrier, such as a glass carrier. The structures for the control transistors are then processed in the thin layer on the transparent carrier, and an amorphous light-emitting material, especially an organic material for OLEDs, is applied to the transistors to form the display elements.

In another method for manufacturing such a display device, a thin layer of a semiconductor material with a large band gap is initially produced, and the structures for the control transistors are processed in the thin layer. The processed thin layer is then applied to a transparent carrier, such as a glass carrier, and an amorphous light-emitting material, especially an organic material for OLEDs, is applied to the transistors to form the display elements.

In both manufacturing versions, a color display device can be manufactured by producing display elements for various colors, especially for red, green and blue, with corresponding control transistors, each on a transparent carrier, such as a glass carrier, and the transparent carriers with the display elements can then be adjusted relative to one another.

Alternatively, to manufacture a color display device using either version, the display elements for various colors, especially for red, green and blue, with corresponding control transistors, can be produced by means of planarizing technology by directly and vertically stacking said elements on a shared transparent carrier, such as a glass carrier.

In the display device of the invention, a clear allocation can exists between the individual display elements and the control transistors. In another embodiment, each control transistor controls multiple individual display elements.

Additional advantageous embodiments, features and details of the invention are described in the dependent claims, the description of the exemplary embodiments and the drawings. The invention is described in greater detail below on the basis of exemplary embodiments in connection with the drawings. Only those elements essential for understanding the invention are shown.

DESCRIPTION OF DRAWINGS

FIG. 1 shows a schematic section of a monochrome display according to an exemplary embodiment of the invention.

FIG. 2 shows a schematic section of a color display according to an exemplary embodiment of the invention.

FIG. 3 shows a schematic section of a color display according to another exemplary embodiment of the invention.

In the exemplary embodiments, the same reference marks are used to identify identical or identically acting components.

DETAILED DESCRIPTION

The monochrome display 10 shown in FIG. 1 includes a two-dimensional array of OLED pixels 12, each of which is controlled by a TFT transistor 14. The OLED pixels 12 and the TFT transistors 14 are disposed on a glass carrier 16. For the sake of clarity, only three pixels of the multitude of OLED pixels 12 and TFT transistors 14 are shown in FIG. 1 and in the following figures.

In the exemplary embodiment, the TFT transistors 14 are manufactured from Ga(In,Al)N and are transparent for radiation in the visible spectral range, thus minimizing absorption losses through photo-absorption of the radiation emitted by the OLED pixels 12.

The arrangement shown in FIG. 1 can also be used for the color display. In this case, various OLED pixels 12 are configured for the emission of various wavelengths. For example, the three OLED pixels shown in FIG. 1 can be configured for the emission of red, green and blue. Through the extension of the display device, several groups, each including three different-colored OLED pixels 12, are disposed adjacent to one another.

The color display 20 shown in FIG. 2 includes three stacked color groups 20R, 20G and 20B, which emit red, green and blue light. Accordingly, the OLEDs 22R of the first color group 20R are configured for the emission of red light, the OLEDs 22G of the second color group 20G for the emission of green light, and the OLEDs 22B of the third color group 20B for the emission of blue light. The OLEDs 22R, 22G and 22B are applied to TFT transistors 24R, 24G and 24B, respectively, which in turn are mounted on small glass plates 26R, 26G and 26B.

In the exemplary embodiment, the TFT transistors 24R, 24G and 24B are produced on a SiC base, and thus feature a band gap above the visible spectral range. The radiation of the OLEDs 22R, 22G and 22B is therefore only absorbed to a negligible extent, if at all, by the transistors of the control electronics.

To manufacture the color display 20 shown in FIG. 2, thin SiC layers are produced and applied to glass carriers 26R, 26G and 26B. The structures for the control transistors 24R, 24G and 24B are then processed in the thin SiC layers. Finally, an amorphous, light-emitting organic material suitable for each emission wavelength (red, green, blue) is applied to the transistors 24R, 24G and 24B to form the display elements 22R, 22G and 22B. Another version of a color display is shown in FIG. 3. In the color display 30 shown in FIG. 3, the pairs of OLED pixels 32R, 32G and 32B and corresponding control transistors 34R, 34G and 34B for the different colors (red, green, blue) are also stacked in different planes. In contrast to the embodiment shown in FIG. 2, all OLED pixels and control transistors are applied to a shared glass substrate 36. This can be accomplished, for example, using planarizing technology known in the art, such as SiO2 planarizing. In this exemplary embodiment, the TFT transistors 34R, 34G and 34B are produced on a II–VI semiconductor material ZnS base, whose large band gap ensures, also in this exemplary embodiment, that the visible radiation of the OLED pixels 32R, 32G and 32B is only absorbed to a negligible extent, if at all.

Of course, the description of the invention on the basis of the exemplary embodiments is not to be construed as limiting the invention to said embodiments. Naturally, the features, both individually and in any possible combination, of the invention disclosed in the description, in the drawings and in the claims can be essential for realizing the invention.

The invention claimed is:

1. A display device comprising:
a first array of individual display elements; and
a second array of control transistors for the display elements, wherein the control transistors include a semiconductor material with a band gap sufficiently large to be transparent in the visible spectral range and wherein the semiconductor material includes boron nitride.

2. The display device of claim 1, wherein the display elements include organic light-emitting elements.

3. The display device of claim 2, wherein the organic light-emitting elements include a layer sequence having a cathode, an electron transport layer, an organic light-emitting layer, a hole transport layer and an anode.

4. The display device of claim 1, wherein the display elements include liquid crystal elements.

5. The display device of claim 1, wherein the band gap of the semiconductor material of the control transistors is larger than 3 eV.

6. The display device of claim 1, wherein each control transistor controls several of the individual display elements.

7. The display device of claim 1, wherein the control transistors are formed in one or more thin layers of the semiconductor material.

8. The display device of claim 7, wherein a thin layer of the semiconductor material has a layer thickness in the range of approximately 0.5 µm to approximately 20 µm.

9. The display device of claim 1, wherein the array of display elements contains multiple sub-arrays, the display elements of each sub-array being designed and configured for showing various colors.

10. The display device of claim 9, wherein the array of display elements contains three sub-arrays, wherein the display elements of each sub-array is designed and configured for showing red, green and blue.

11. The display device of claim 9, wherein the multiple sub-arrays are disposed in the same plane on a carrier substrate.

12. The display device of claim 9, wherein the multiple sub-arrays are disposed in stacked layers in multiple planes.

13. The display device of claim 12, wherein each of the multiple sub-arrays is disposed on its own carrier substrate.

14. The display device of claim 13, wherein the carrier substrate is a glass plate.

15. The display device of claim 1, wherein each control transistor controls exactly one of the individual display elements.

16. A display device, comprising:
a first array of individual display elements; and
a second array of control transistors for the display elements, wherein the control transistors are formed from a semiconductor material with a band gap sufficiently large to be transparent in the visible spectral range, wherein the semiconductor material includes boron nitride.

17. A method of manufacturing a display device, comprising:
applying a layer of a semiconductor material having a band gap sufficiently large to be transparent in the visible spectral range to a transparent carrier, wherein the semiconductor material includes boron nitride;
processing the layer on the transparent carrier to provide a first array of control transistors; and
applying an amorphous light-emitting material to the control transistors to form a second array of individual display elements.

18. The method of claim 17, wherein the amorphous light-emitting material comprises an organic material for organic light emitting diodes.

19. The method of claim 17, wherein the transparent carrier is a glass carrier.

20. A method for manufacturing a display device, comprising:
processing a layer of a semiconductor material having a band gap sufficiently large to be transparent in the visible spectral range to provide a first array of control transistors, wherein the semiconductor material includes boron nitride;
applying the processed layer to a transparent carrier; and
applying an amorphous light-emitting material to the control transistors to form a second array of individual display elements.

21. The method of claim 20, wherein the amorphous light-emitting material comprises an organic material for organic light emitting diodes.

22. The method of claim 20, wherein the transparent carrier is a glass carrier.

23. The method of claim 20, further comprising:
producing the display elements for different colors with the corresponding control transistors, each display element being disposed on a transparent carrier; and
adjusting the transparent carriers with the display elements relative to one another.

24. The method of claim 23, wherein the transparent carrier is a glass carrier.

25. The method of claim 23, wherein the display elements are produced for red, green, and blue.

26. The method of claim 20, further comprising:
producing the display elements for different colors with corresponding control transistors, using planarizing technology to directly and vertically stack the elements on a shared transparent carrier.

27. The method of claim 26, wherein the transparent carrier is a glass carrier.

28. The method of claim 26, wherein the display elements are produced for red, green, and blue.

* * * * *

UNITED STATES PATENT AND TRADEMARK OFFICE
CERTIFICATE OF CORRECTION

| | | |
|---|---|---|
| PATENT NO. | : 7,235,920 B2 | Page 1 of 1 |
| APPLICATION NO. | : 10/670917 | |
| DATED | : June 26, 2007 | |
| INVENTOR(S) | : Volker Haerle and Berthold Hahn | |

It is certified that error appears in the above-identified patent and that said Letters Patent is hereby corrected as shown below:

Column 6, Lines 14 & 15 at Claim 23; replace:
    "different colors with the corresponding" with
    --different colors with corresponding--

Signed and Sealed this

Seventh Day of August, 2007

JON W. DUDAS
*Director of the United States Patent and Trademark Office*